(12) United States Patent
Ryu

(10) Patent No.: US 7,312,093 B2
(45) Date of Patent: Dec. 25, 2007

(54) IMAGE SENSOR CAPABLE OF ADJUSTING FOCUSING LENGTH FOR INDIVIDUAL COLOR AND FABRICATION METHOD THEREOF

(75) Inventor: Sang-Wook Ryu, Chungcheongbuk-do (KR)

(73) Assignee: MagnaChip Semiconductor, Ltd., Chungcheongbuk-Do (KR)

( * ) Notice: Subject to any disclaimer, the term of this patent is extended or adjusted under 35 U.S.C. 154(b) by 0 days.

(21) Appl. No.: 11/322,043

(22) Filed: Dec. 28, 2005

(65) Prior Publication Data

US 2006/0145223 A1 Jul. 6, 2006

(30) Foreign Application Priority Data

Dec. 30, 2004 (KR) .................. 10-2004-0115991

(51) Int. Cl.
*H01L 21/00* (2006.01)
*H01L 31/00* (2006.01)

(52) U.S. Cl. .................. 438/29; 257/294; 250/214.1

(58) Field of Classification Search .................. 438/22, 438/29; 257/294; 250/214.1, 226; 359/410
See application file for complete search history.

(56) References Cited

U.S. PATENT DOCUMENTS 5,466,926 A 11/1995 Sasano et al.

| | | | | |
|---|---|---|---|---|
| 5,493,143 A | * | 2/1996 | Hokari | ........................ 257/432 |
| 6,127,670 A | | 10/2000 | Miyahara | |
| 6,232,590 B1 | | 5/2001 | Baek | |
| 6,556,349 B2 | * | 4/2003 | Cox et al. | .................... 359/626 |
| 6,696,307 B2 | * | 2/2004 | Hwang et al. | ................ 438/22 |
| 7,049,168 B2 | * | 5/2006 | Findlater et al. | .............. 438/69 |

FOREIGN PATENT DOCUMENTS

| KR | 100278983 B1 | 10/2000 |
|---|---|---|
| KR | 10-2004-0115991 | 12/2004 |
| TW | 452853 B | 9/2001 |

* cited by examiner

*Primary Examiner*—W. David Coleman
(74) *Attorney, Agent, or Firm*—Greenberg Traurig, LLP

(57) ABSTRACT

An image sensor and a fabrication method thereof are provided. The image sensor includes: a first photodiode formed in a substrate and receiving a first color; a second photodiode formed in the substrate apart from the first photodiode and receiving a second color with a wavelength longer than that of the first color; a third photodiode formed in the substrate apart from the first photodiode and the second photodiode and receiving a third color with a wavelength longer than that of the second color; and a passivation layer formed on the substrate and having different regional thicknesses whose magnitude increases in order of a first region of the passivation layer corresponding to a first color region, a second region of the passivation layer corresponding to a second color region and a third region of the passivation layer corresponding to a third color region.

12 Claims, 5 Drawing Sheets

(n2>>n1)

IMAGE SENSOR CAPABLE OF ADJUSTING FOCUSING LENGTH FOR INDIVIDUAL COLOR AND FABRICATION METHOD THEREOF

FIELD OF THE INVENTION

The present invention relates to an image sensor; and, more particularly, to an image sensor capable of coinciding focusing lengths of individual colors with different wavelengths.

DESCRIPTION OF RELATED ARTS

An image sensor is a semiconductor device that converts an optical image into an electrical signal. Among various types of image sensors, a charge coupled device (CCD) is a device that charge carriers are stored into and transferred to or from the metal oxide semiconductor (MOS) capacitors, which are closely allocated with each other.

A complementary metal oxide semiconductor (CMOS) image sensor adopts a switching mode that detects outputs sequentially with use of MOS transistors prepared as many as pixels by employing CMOS technology, which utilizes a control circuit and a signal processing circuit as a peripheral circuit.

FIG. 1 is a top view showing an array of unit pixels of a conventional CMOS image sensor.

The unit pixels for capturing three primary colors of light, i.e., red (R), green (G) and blue (B), are arranged in a lattice structure.

FIG. 2 is a cross-sectional view showing the unit pixels for three primary colors of the conventional CMOS image sensor taking along a line A-A' of FIG. 1.

Field oxide layers 101 are formed regionally on a substrate 100 in which a stack structure of a highly doped $P^{++}$-type impurity region and a P-type epi layer is formed. Although not illustrated, a plurality of gate structures including transfer gates are formed. A plurality of photodiodes 102 are formed in the substrate 100. Although not illustrated, each of the photodiodes 102 includes an N-type region formed by implanting an N-type impurity into a deep region of the substrate 100 aligned with one side of the corresponding transfer gate and a P-type region formed in a portion of the substrate 100 disposed beneath the surface of the substrate 100.

Also, although not illustrated, a plurality of highly doped $N^+$-type floating diffusion regions are formed. Particularly, each of the highly doped $N^+$-type floating diffusion regions is formed by implanting a highly doped $N^+$-type impurity into another portion of the substrate 100 disposed beneath the surface of the substrate 100 aligned with the other side of the corresponding transfer gate.

A multi-layer structure 103 including a plurality of metal lines and a plurality of insulation layers is formed on the substrate 100 where the photodiodes 102, the transfer gates and the $N^+$-type floating diffusion regions are formed. The plurality of the metal lines connect a power line or a signal line with the unit pixels and logic circuits and simultaneously shield light from entering into regions except for the photodiodes 102.

The multi-layer structure 103 can further include a pre-metal dielectric (PMD) layer formed beneath the plurality of the metal lines and an inter-metal dielectric (IMD) layer formed between the metal lines. The PMD layer and the IMD layer are usually formed of an oxide material such as silicon oxide.

A passivation layer 104 is formed on the multi-layer structure 103 to protect the metal lines. The passivation layer 104 includes a stack structure obtained by sequentially stacking a thin oxide layer and a thick nitride layer.

A first over-coating layer 105 is formed on the passivation layer 104 to decrease a height difference created as the metal lines are formed. A color filter array 106 is formed on the first over-coating layer 105 to realize RGB colors for each corresponding pixel. In addition to these three primary colors, i.e., RGB colors, other complementary colors such as yellow (Y), magenta (Mg) and cyan (Cy) can also be realized.

A second over-coating layer 107 is formed on the color filter array 106 to secure a process margin for forming subsequent microlenses by decreasing a height difference creased as the color filter array 106 is formed. On the second over-coating layer 107, the aforementioned microlenses 108 are formed. Although not illustrated, another passivation layer can be formed on the microlenses 108 to prevent scratches or damages on the microlenses.

Hence, incident lights are focused by the microlenses 108 and enter into the photodiodes 102.

An image sensor includes a photodiode region which detects light, i.e., a light collection region, and a logic circuit region which converts light into an electrical signal which can be processed as data. CMOS image sensors with the size of 0.18 μm generally require a logic circuit with metal lines formed in more than triple layers. Such metal lines require more than triple layers of IMD layers.

Hence, as shown in FIG. 2, a depth from the bottom surface of the microlenses 108 to the upper surface of the photodiode 102 ranges from approximately 5 μm to approximately 8 μm. As light passes through a certain medium, light has different refraction indices depending on wavelengths. This characteristic of light is called wavelength-dependent refraction index.

FIG. 3 is a diagram showing paths of incident lights with different wavelengths at the same medium.

AS shown, rays of light with different wavelengths, for instance, a wavelength of a first ray of light '$\lambda 1$' is longer than that of a second ray of light '$\lambda 2$', pass through the same medium. At this time, the second ray of light with the shorter wavelength of '$\lambda 2$' has a smaller refraction angle. The smaller the refraction angle is, the higher the refraction occurs. Therefore, a refraction level at the visible ray region ranges in order of blue (B), green (G) and red (R).

FIG. 4 is a diagram showing a degree of forming focuses when rays of white light pass through a lens.

The shorter the wavelength is, the shorter the focusing length is, and a reference denotation 'A' verifies this behavior. Similarly, the longer the wavelength is, the longer the focusing length is, and a reference denotation 'B' verifies this behavior.

FIG. 5 is a diagram showing paths of incident lights with the same wavelength passing through different media.

When the media are formed of different materials, the incident lights with the same wavelength have different refraction angles depending on a level of refraction index. If the refraction index value is larger at a certain wavelength, the incident light is refracted in a greater extent.

With reference to FIG. 1, the three primary colors (i.e., RGB colors) are focused at different regions of the photodiodes 102. More specifically, the focusing length decreases in order of red (R), green (G) and blue (B).

Therefore, if the photodiodes are allocated at the same position, the focusing length for each color may be different, and thus, photosensitivity may be decreased.

SUMMARY OF THE INVENTION

It is, therefore, an object of the present invention to provide an image sensor capable of preventing decrease of photosensitivity due to different focusing lengths for individual colors with different wavelengths, and a method for fabricating the same.

In accordance with an aspect of the present invention, there is provided an image sensor, including: a first photodiode formed in a substrate and receiving a first color; a second photodiode formed in the substrate apart from the first photodiode and receiving a second color with a wavelength longer than that of the first color; a third photodiode formed in the substrate apart from the first photodiode and the second photodiode and receiving a third color with a wavelength longer than that of the second color; and a passivation layer formed on the substrate including the first photodiode to the third photodiode and having different regional thicknesses whose magnitude increases in order of a first region of the passivation layer corresponding to a first color region, a second region of the passivation layer corresponding to a second color region and a third region of the passivation layer corresponding to a third color region.

In accordance with another aspect of the present invention, there is provided a method for fabricating an image sensor, including: forming a first photodiode receiving a first color, a second photodiode formed apart from the first photodiode and receiving a second color with a wavelength longer than the first color and a third photodiode formed apart form the first photodiode and the second photodiode and receiving a third color with a wavelength longer than the second color; forming a passivation layer on a substrate structure in which the first photodiode to the third photodiode are formed; and selectively etching the passivation layer such that the passivation layer has different regional thicknesses whose magnitude increase in order of a first region of the passivation layer corresponding to a first color region, a second region of the passivation layer corresponding to a second color region and a third region of the passivation layer corresponding to a third color region.

In accordance with still another aspect of the present invention, there is provided a method for fabricating an image sensor, including: forming a first photodiode receiving a first color, a second photodiode formed apart from the first photodiode and receiving a second color with a wavelength longer than the first color and a third photodiode formed apart form the first photodiode and the second photodiode and receiving a third color with a wavelength longer than the second color; forming a passivation layer on a substrate structure in which the first photodiode to the third photodiode are formed; etching a region of the passivation layer corresponding to the first color region and the second color region with a predetermined thickness; and etching another region of the passivation layer corresponding to the first color region with a predetermined thickness.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

An image sensor capable of adjusting a focusing length for an individual color and a fabrication method thereof in accordance with exemplary embodiments of the present invention will be described in detail with reference to the accompanying drawings.

Figure 1:
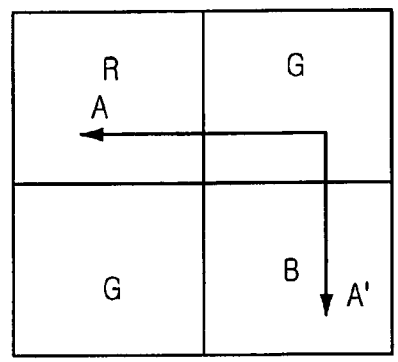
FIG. 1 is a top view showing an array of unit pixels of a conventional complementary metal oxide semiconductor (CMOS) image sensor.
Figure 2:
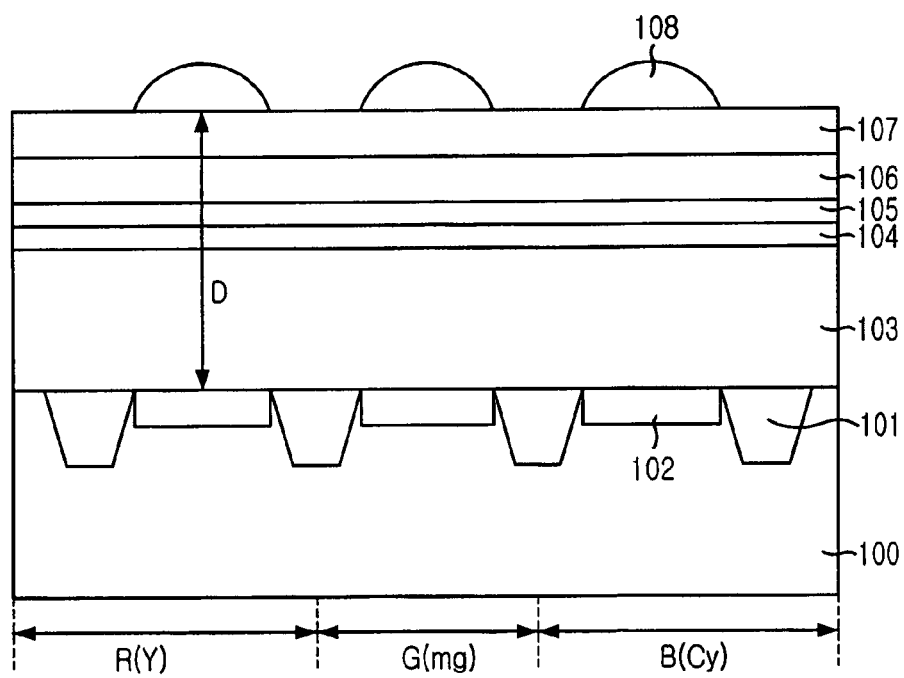
FIG. 2 is a cross-sectional view showing the unit pixels for three primary colors of red (R), green (G) and blue (B) of the conventional CMOS image sensor taking along a line A-A' of FIG. 1.
Figure 3:
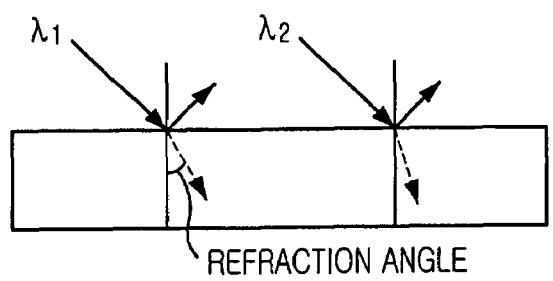
FIG. 3 is a diagram showing paths of incident lights with different wavelengths at the same medium.
Figure 4:
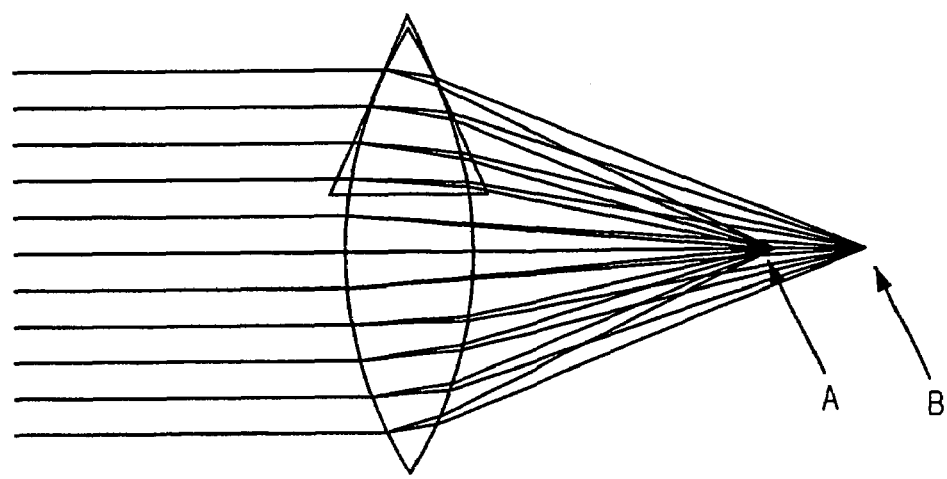
FIG. 4 is a diagram showing a degree of forming focuses when rays of white light pass through a lens.
Figure 5:
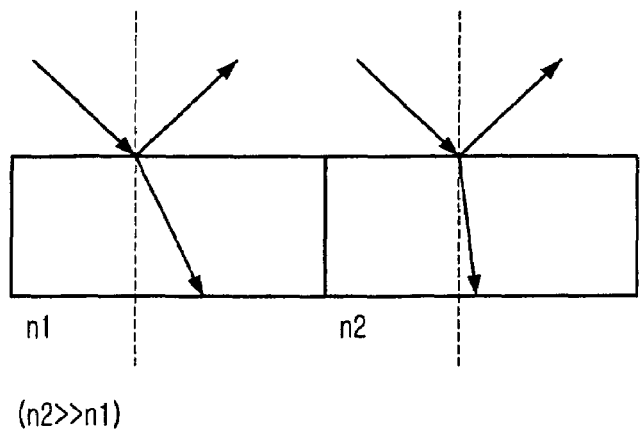
FIG. 5 is a diagram showing paths of incident lights with the same wavelength at different media.
Figure 6:
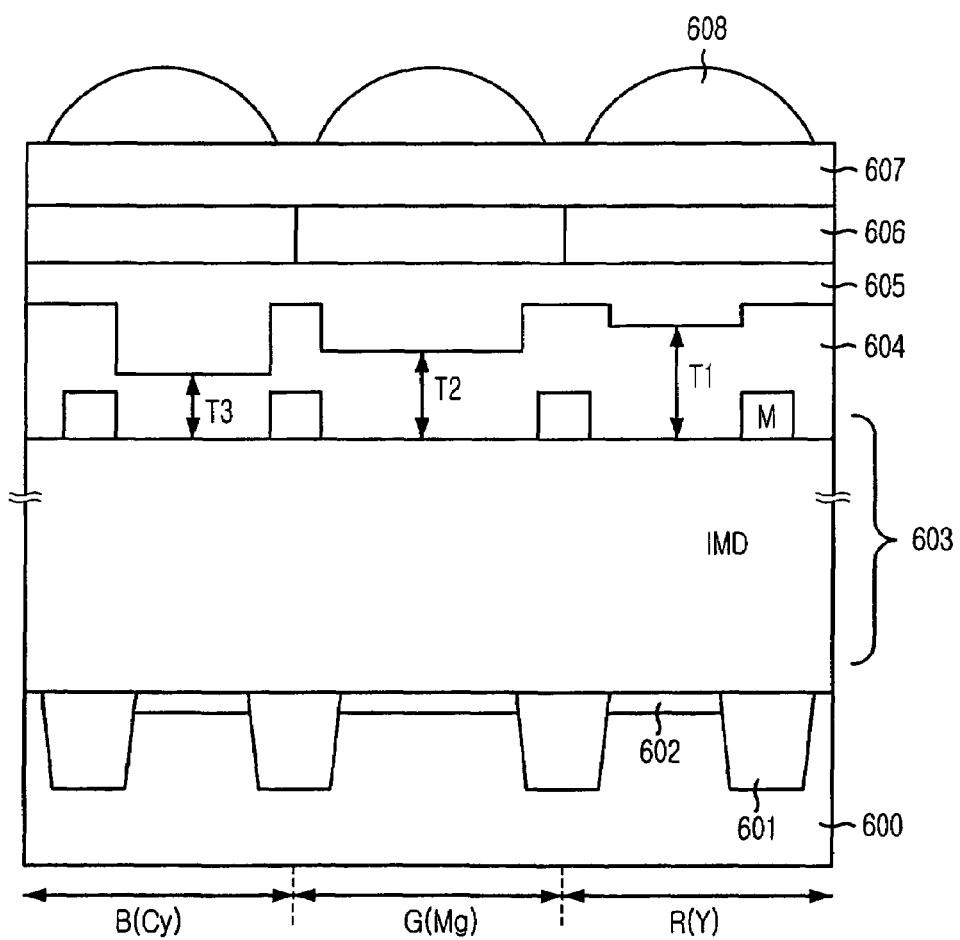
FIG. 6 is a cross-sectional view showing unit pixels of an image sensor in accordance with an embodiment of the present invention.

FIG. 6 is a cross-sectional view illustrating unit pixels of an image sensor in accordance with an embodiment of the present invention.

The image sensor includes: a plurality of photodiodes 602; a multi-layer structure 603 including multiple layers formed on the plurality of the photodiodes 602; a passivation layer 604 formed on the multi-layer structure 603 and having different regional thicknesses for individual colors; a first over-coating layer 605; a color filter array 606; a second over-coating layer 607; and a plurality of microlenses 608.

Especially, the passivation layer 604 includes a nitride material having a higher level of refraction index than an oxide material used for forming the first over-coating layer 605, the second over-coating layer 607, and the multi-layer structure 603 including inter-metal dielectric (IMD) layers and pre-metal dielectric (PMD) layers. Also, the passivation layer 604 is divided into a first region corresponding to a blue or cyan color region B or Cy whose wavelength is the shortest among the three denoted colors in FIG. 6, a second region corresponding to a green or magenta color region G or Mg and a third region corresponding to a red or yellow color region R or Y whose wavelength is the longest among the three denoted colors in FIG. 6. The first region, the second region and the third region of the passivation layer 604 have different thicknesses whose magnitude increase in order of the first region, the second region and the third region. Reference denotations T1, T2 and T3 express the thickness of the third region, the second region and the first region of the passivation layer 604, respectively, and will be respectively referred to as a first thickness, a second thickness and a third thickness hereinafter.

In more detail of the image sensor configuration, field oxide layers 601 are formed regionally on a substrate 600 including a stack structure of a highly doped $P^{++}$-type impurity region and a P-type epi layer. Although not illustrated, gate structures including transfer gates are formed on the substrate 600, and each of the photodiodes 602 includes an N-type region, which is formed by implanting an impurity into a deep region of the substrate 600 aligned with one side of the corresponding transfer gate, and a P-type region, which is formed in a region beneath the surface of the substrate 600.

Although not illustrated, floating diffusion regions are formed by implanting a highly doped N+-type impurity into another region of the substrate 600 aligned with the other side of the corresponding transfer gate.

The multi-layer structure 603 includes a plurality of metal lines and a plurality of insulation layers and is formed over the photodiodes 602 and the gate structures. The plurality of the metal lines connect a power line or signal line with unit pixels and logic circuits, and shield an incident light from entering into regions except for the photodiodes 602.

The multi-layer structure 603 includes the aforementioned PMD layers formed beneath the plurality of the metal lines and the aforementioned IMD layers formed between the metal lines. The PMD layers and the IMD layers include an oxide material such as silicon oxide.

The passivation layer 604 is formed on the multi-layer structure 603, and has a stack structure including a thin oxide layer and a thick nitride layer formed in sequential order.

The first over-coating layer 605 is formed on the passivation layer 604 to reduce a height difference created as the metal lines are formed. On the first over-coating layer 605, the color filer array 606 is formed to realize three primary colors, i.e., RGB colors, for individual unit pixels. In addition to the typical three primary colors, other complementary colors such as yellow (Y), magenta (Mg) and cyan (Cy) can be realized as well.

The second over-coating layer 607 is formed on the color filter array 606 to secure a process margin for forming the microlenses 608 by reducing a height difference generated as the color filter array 606 is formed, and the microlenses 608 are formed on the second over-coating layer 607.

Although not illustrated, another passivation layer is formed on the microlenses 608 to prevent scratches or damage on the microlenses 608. Therefore, the microlenses 608 focus the incident lights, which subsequently enter into the photodiodes 602. As described above, the passivation layer 604 is formed with different regional thicknesses for individual unit pixels receiving incident lights with different wavelengths, and thus, the incident lights can be focused at the photodiodes 602.

Figure 7:
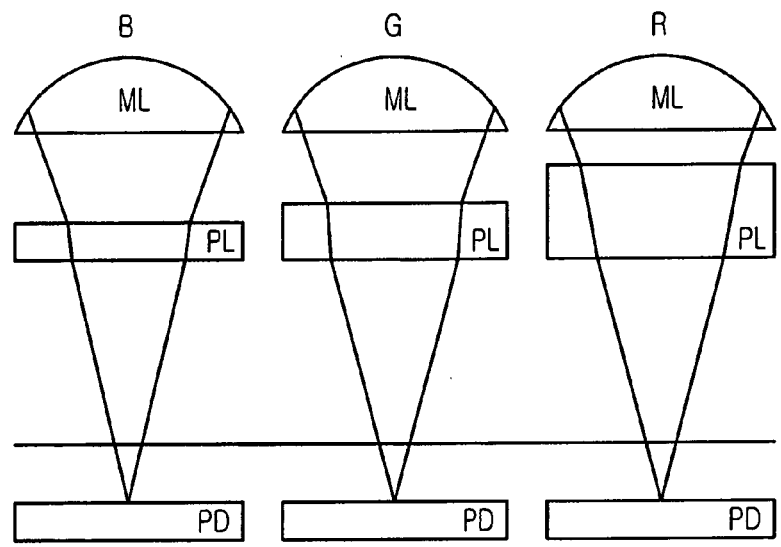
FIG. 7 is a diagram illustrating different focusing lengths when passivation layers are formed to have different thicknesses depending on wavelengths of incident lights.

FIG. 7 is a diagram illustrating different focusing lengths when passivation layers are formed with different thicknesses depending on wavelengths of incident lights.

As illustrated in FIG. 7, incident lights passing through microlenses ML are partially refracted at the corresponding passivation layers PL, which are formed of a nitride material having a high level of refraction index. Depending on wavelengths of the incident lights, the passivation layers PL have different thicknesses, so that the incident lights, in this case, three different incident lights with different wavelengths, have the same focusing length at photodiode regions PD.

Figure 8A:
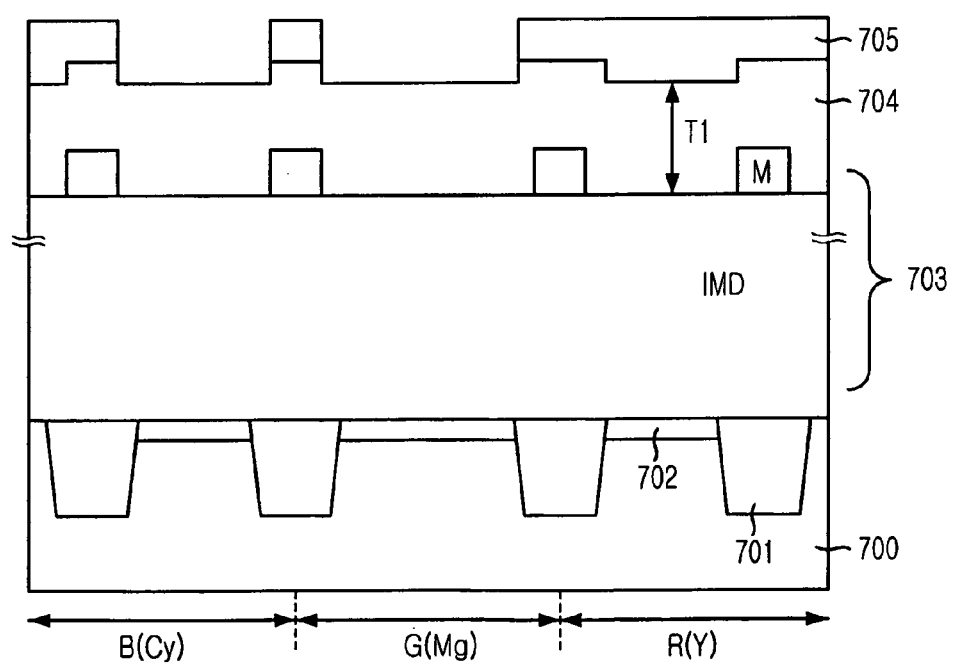
FIGS. 8A to 8C are cross-sectional views illustrating a method for fabricating an image sensor in accordance with an embodiment of the present invention.

Hereinafter, a method for fabricating the image sensor shown in FIG. 6 will be described in detail with reference to FIGS. 8A to 8C.

Field oxide layers 701 and well regions (not shown) are formed in a substrate 700 including a stack structure of a highly doped P++-type impurity region and a P-type epi layer. Although not illustrated, patterned gate conductive layers are formed on the substrate 700, and deep N-type regions, each aligned with one side of the corresponding patterned gate conductive layer, are formed using an ion implantation process. Spacers are then formed on sidewalls of the patterned gate conductive layers.

Although not illustrated, floating diffusion regions are formed by implanting a highly doped N-type impurity into a region of the substrate 700 aligned with the spacer of the corresponding patterned gate conductive layer at the other side. Afterwards, shallow $P^0$-type regions are formed on the N-type regions, thereby forming photodiodes 702. Each of the photodiodes 702 includes the N-type region and a shallow $P^0$-type region formed on the N-type region. The photodiodes 702 can be buried type photodiodes, and can be formed to be disposed on the substrate 700.

A multi-layer structure 703 is formed on the substrate 700. The multi-layer structure 703 includes a plurality of metal lines M and a plurality of insulation layers, more particularly, IMD layers IMD. A passivation layer 704 is formed on the multi-layer structure 703. The passivation layer 704 includes a thin oxide layer and a thick nitride layer formed in sequential order.

A first photoresist pattern 705 is formed on the passivation layer 704 such that the first photoresist pattern 705 masks a red color region R with the longest wavelength among the illustrated three colors R, G and B but opens a green color region G and a blue color region B. The passivation layer 704 has an initial thickness T1 ranging from approximately 2,000 Å to approximately 30,000 Å.

Figure 8B:
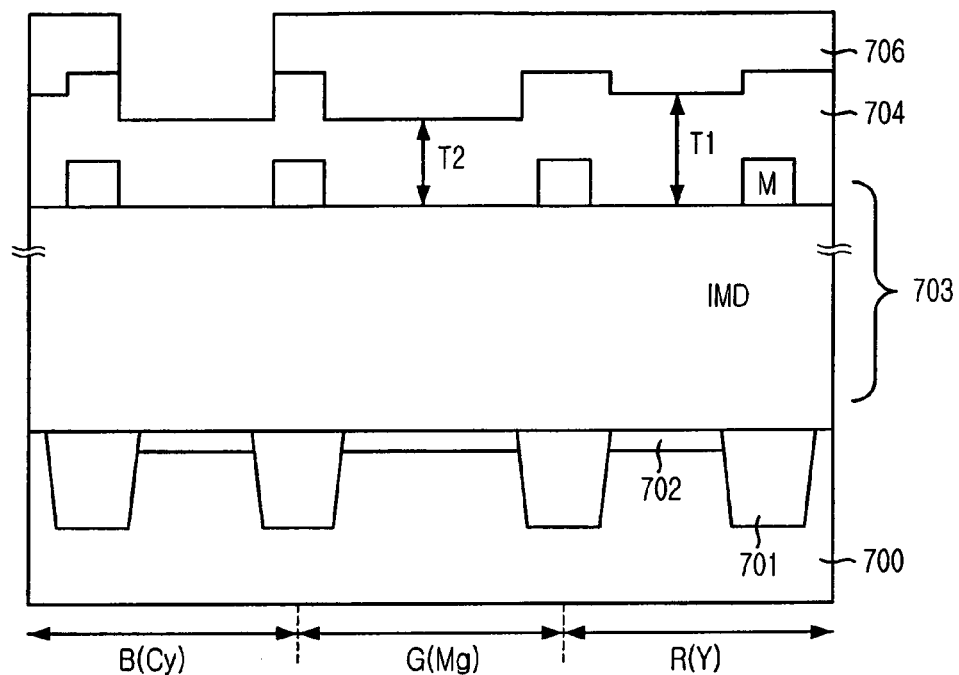

Referring to FIG. 8B, a portion of the passivation layer 704 corresponding to the green and blue color regions G and B are etched using the first photoresist pattern 705 as an etch mask, so that the portion of the passivation layer 704 has a thickness T2. At this point, the etching of the portion of the passivation layer 704 (hereinafter referred to as "first etching process) is carried out by employing a dry etching process using a gas containing a halogen element. For instance, the gas includes one selected from the group consisting of $SF_6$, $Cl_2$, $C_xH_yF_z$, where x, y and z are in a range from 0 to natural numbers. During the first etching process, the etch target thickness of the portion of the passivation layer 704 can be adjusted depending on a frequency for each wavelength. The etch target thickness of the portion of the passivation layer 704 ranges from approximately 100 Å to approximately 10,000 Å.

The first photoresist pattern 705 is removed by a stripping process.

A second photoresist pattern 706 is formed on the passivation layer 704 such that the second photoresist pattern 706 masks the green color region G and the red color region R but opens the blue color region B with the shortest wavelength among the illustrated three colors R, G, and B.

Figure 8C:
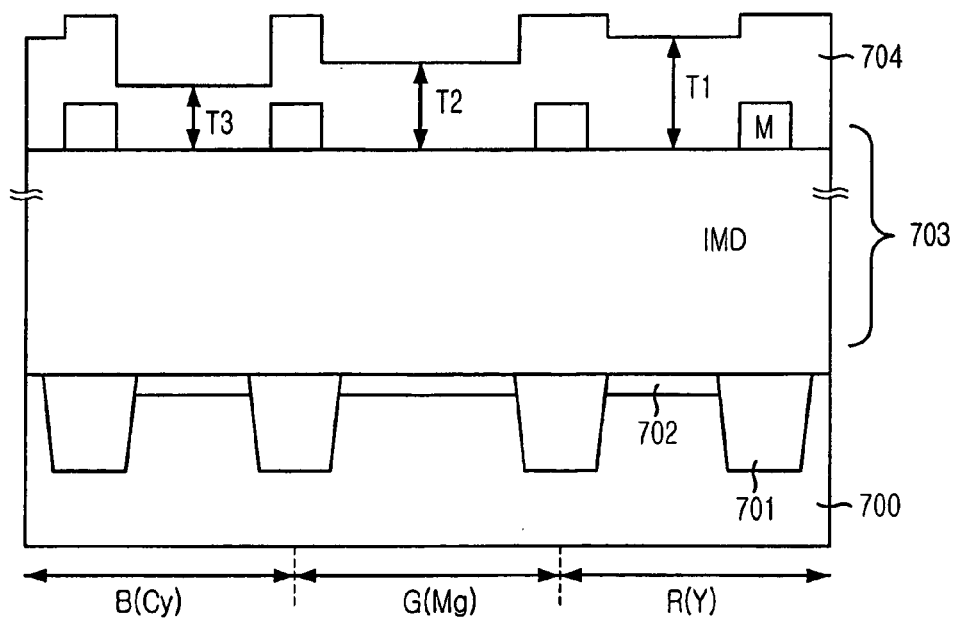

Referring to FIG. 8C, another portion of the passivation layer 704 corresponding to the blue color region B is etched using the second photoresist pattern 706 as an etch mask, so that the other portion of the passivation layer 704 has a thickness T3. This etching process will be referred to as "second etching process." At this point, the second etching process employs a dry etching process to etch the other portion of the passivation layer 704 corresponding to the blue color region B using the same etch condition described in FIG. 8B. During the second etching process, the etch target thickness of the other portion of the passivation layer 704 can be adjusted depending on a frequency for each wavelength. The etch target thickness of the other portion of the passivation layer 704 ranges from approximately 100 Å to approximately 10,000 Å.

The second photoresist pattern 706 is removed, and a cleaning process is performed thereafter.

Although it is illustrated in the above exemplary embodiment that the first etching process is performed on the portion of the passivation layer corresponding to the blue color region B and the green color region G and the second etching process is performed on the other portion of the passivation layer corresponding to the blue color region B, portions of the passivation layer 704 corresponding to the blue color region B and the green color region G can be etched separately.

Also, an additional etching process can be performed on a portion of the passivation layer 704 corresponding to the red color region R to allow an incident light to be focused at the red color region R. Although not illustrated, a first over-coating layer, a color filter array, a second over-coating layer, microlenses, and a low thermal oxide layer are sequentially formed on the passivation layer 704.

In accordance with the exemplary embodiments of the present invention, a focusing length for each color can be adjusted and thus, an optical characteristic of the image sensor can be improved. Also, a system-on-chip (SOC) of a high-performance logic device required in multiple metal lines can be realized in a CMOS image sensor.

Even if photodiodes are allocated further away from a light impinging region (i.e., microlenses) as the number of the metal lines increases, a focusing length for each color can be adjusted. As a result, an optical characteristic can be adjusted as well.

Although the exemplary embodiments of the present invention on a CMOS image sensor are described, the exemplary embodiments can be applied to other types of image sensors with photodiodes and microlenses.

Also, although a color filter array for three primary colors, RGB colors, is exemplified in the above embodiments of the present invention, the present embodiments can be applied to a color filter array for other complementary colors, YMgCy colors.

The present application contains subject matter related to the Korean patent application No. KR 2004-0115991, filed in the Korean Patent Office on Dec. 30, 2004, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating an image sensor, comprising:
    forming a first photodiode receiving a first color, a second photodiode formed apart from the first photodiode and receiving a second color with a wavelength longer than the first color and a third photodiode formed apart form the first photodiode and the second photodiode and receiving a third color with a wavelength longer than the second color;
    forming a passivation layer on a substrate structure in which the first photodiode to the third photodiode are formed; and
    selectively etching the passivation layer such that the passivation layer has different regional thicknesses whose magnitude increase in order of a first region of the passivation layer corresponding to a first color region, a second region of the passivation layer corresponding to a second color region and a third region of the passivation layer corresponding to a third color region.

2. The method of claim 1, wherein the passivation layer includes a nitride material.

3. The method of claim 1, after the forming of the first photodiode to the third photodiode, further comprising forming a multi-layer structure including a plurality of metal lines and a plurality of insulation layers.

4. The method of claim 3, wherein the plurality of the insulation layers include an oxide material.

5. The method of claim 3, wherein the third region of the passivation layer formed above the third photodiode has a thickness ranging from approximately 2,000 Å to approximately 30,000 Å.

6. The method of claim 1, wherein at the selective etching of the passivation layer, an etched thickness of the passivation layer ranges from approximately 100 Å to approximately 10,000 Å.

7. A method for fabricating an image sensor, comprising:
    forming a first photodiode receiving a first color, a second photodiode formed apart from the first photodiode and receiving a second color with a wavelength longer than the first color and a third photodiode formed apart form the first photodiode and the second photodiode and receiving a third color with a wavelength longer than the second color;
    forming a passivation layer on a substrate structure in which the first photodiode to the third photodiode are formed;
    etching a region of the passivation layer corresponding to the first color region and the second color region with a predetermined thickness; and
    etching another region of the passivation layer corresponding to the first color region with a predetermined thickness.

8. The method of claim 7, wherein the passivation layer includes a nitride material.

9. The method of claim 7, wherein after the forming of the first photodiode to the third photodiode, further comprising forming a multi-layer structure including a plurality of metal lines and a plurality of insulation layers.

10. The method of claim 7, wherein at the etching of the region of the passivation layer and at the etching of the other region of the passivation layer, the predetermined etch thickness of the passivation layer ranges from approximately 100 Å to approximately 10,000 Å.

11. The method of claim 9, wherein the plurality of the insulation layers include an oxide material.

12. The method of claim 9, wherein third region of the passivation layer formed above the third photodiode has a thickness ranging from approximately 2,000 Å to approximately 30,000 Å.

* * * * *